United States Patent [19]

Nakano et al.

[11] Patent Number: 4,752,914
[45] Date of Patent: Jun. 21, 1988

[54] SEMICONDUCTOR INTEGRATED CIRCUIT WITH REDUNDANT CIRCUIT REPLACEMENT

[75] Inventors: Masao Nakano, Kawasaki; Yoshihiro Takemae, Tokyo; Tomio Nakano, Kawasaki; Takeo Tatematsu, Yokohama; Junji Ogawa, Tokyo; Takashi Horii, Kawasaki; Yasuhiro Fujii, Yokohama; Kimiaki Sato, Tokyo; Norihisa Tsuge, Kamakura; Itaru Tsuge, Kamakura; Sachie Tsuge, Kamakura, all of Japan

[73] Assignee: Fujitsu Limited, Kawasaki, Japan

[21] Appl. No.: 739,159

[22] Filed: May 30, 1985

[30] Foreign Application Priority Data

May 31, 1984 [JP] Japan ............................. 59-109463
Jul. 26, 1984 [JP] Japan ............................. 59-153942

[51] Int. Cl.$^4$ ................ G11C 8/00; G11C 29/00; G11C 7/00
[52] U.S. Cl. ............................. 365/200; 365/189; 365/230; 371/10
[58] Field of Search ............ 365/189, 200, 230; 371/10, 21

[56] References Cited

U.S. PATENT DOCUMENTS

| 4,346,459 | 8/1982 | Sud et al. ............................. 365/200 |
| 4,480,199 | 10/1984 | Varshney et al. ................... 365/200 |
| 4,538,245 | 8/1985 | Smarandoiu et al. .............. 365/200 |
| 4,546,454 | 10/1985 | Gupta et al. ........................ 365/200 |
| 4,571,707 | 2/1986 | Watanabe ........................... 365/200 |
| 4,586,170 | 4/1986 | O'Toole .............................. 371/10 X |

FOREIGN PATENT DOCUMENTS

| 52-23233 | 2/1977 | Japan .................................. 365/200 |
| 60-18899 | 1/1985 | Japan .................................. 365/200 |

Primary Examiner—Stuart N. Hecker
Assistant Examiner—Alyssa H. Bowler
Attorney, Agent, or Firm—Staas & Halsey

[57] ABSTRACT

A semiconductor integrated circuit including a memory unit for storing address information of a failed circuit portion and for replacing the failed circuit portion by a redundant circuit portion. The semiconductor integrated circuit provides a comparison unit for detecting coincidence between data read from the memory unit and a received input address. Data produced from the comparison by the comparison unit is delivered through an external connection terminal.

11 Claims, 10 Drawing Sheets

SEMICONDUCTOR INTEGRATED CIRCUIT WITH REDUNDANT CIRCUIT REPLACEMENT

BACKGROUND OF THE INVENTION

1. Field of the Invention

The present invention relates to an integrated circuit having memory cells. The integrated circuit according to the present invention is used for a memory device having a redundant circuit portion for replacing failed circuits.

2. Description of the Related Art

In general, an integrated circuit device for a semiconductor memory is provided with "redundant-bit" type memory cells in addition to the usually used memory cells. These are used to replace failed memory cells or even to replace an entire bit line containing failed memory cells, in the latter case by a redundant bit line containing redundant memory cells. This increases the yield of the products in the manufacture of integrated circuits.

In such an integrated circuit, read-only memories (ROM's) are provided for storing the addresses of the failed memory cells. When an input address signal coincides with the address of a failed memory cell stored in the ROM's, the circuit is switched to access a redundant memory cell instead of the failed memory cell. Accordingly, quick and correct detection of the written state of the ROM's is important.

However, $2^{n+1}$ cycles are usually required for detecting the written state of the ROM's. Hence, a very long time is required for testing an integrated circuit.

Also, when several fuses are used for each bit in the ROM's, it is impossible to determine the blow-out state of each of the fuses, although the output state of the ROM's can be determined. This is undesirable and causes problems in an integrated circuit device for a semiconductor memory.

SUMMARY OF THE INVENTION

It is an object of the present invention to provide an improved integrated circuit having memory cells, enabling quick and correct detection of the written state of the memory circuit in which the address information of the failed circuit portions is stored, and easy, reliable inspection of the integrated circuit having regular memory cells and redundant circuits, without providing an additional external connection terminal of the integrated circuit.

It is another object of the present invention to reduce the time required for the testing of an integrated circuit having regular memory cells and redundant circuits.

It is still another object of the present invention to enable detection of the blow-out state of each of the plurality of fuses used in the memory cells in the integrated circuit.

According to the present invention, there is provided a semiconductor integrated circuit including a memory unit for storing address information of a failed circuit portion and for replacing the failed circuit portion by a redundant circuit portion; a comparison unit for detecting coincidence between data read from the memory unit and a received input address; and a delivery unit for delivering data obtained from the comparison by the comparison unit through an external connection terminal.

DESCRIPTION OF THE PREFERRED EMBODIMENTS

Before describing a preferred embodiment, an example of a prior art integrated circuit will be described with reference to FIGS. 1, 2, and 3. The device of FIG. 1 includes coincidence detection circuits 2, 2, . . . , corresponding to the number of bits of the input address signals $A_0, A_1, \ldots A_n$, and a depletion type transistor 32 as a load transistor.

Non-inverted and inverted address signals $A_0, \overline{A_0}, A_1, \overline{A_1}, \ldots A_n$ and $\overline{A_n}$ are supplied to the coincidence detection circuits 2, 2 . . . Each of the coincidence detection circuits 2 carries out a comparison between the input address signal and the stored address signal in a ROM 21 in the coincidence detection circuit 2.

When coincidence is attained, the impedance between the voltage source $V_{cc}$ and a control line 31 ($N_1$) becomes HIGH. When coincidence is not attained, the impedance between the voltage source $V_{cc}$ and the control line 31 ($N_1$) becomes LOW.

Hence, when all of the coincidence detection circuits 2 indicate coincidence, the potential of the control line 31 ($N_1$) becomes HIGH, while when one or more of the coincidence detection circuits 2 does not indicate coincidence, the potential of the control line 31 ($N_1$) becomes LOW.

The ROM's 21 in the coincidence detection circuits 2 store the address of a failed memory cell. When the input address signal coincides with the address of the failed memory cell stored in the ROM's, the potential of the control line 31 ($N_1$) becomes HIGH. On the basis of this fact, when the potential of the control line 31 ($N_1$) is HIGH, a redundant memory cell is accessed intead of the failed memory cell. Such a circuit operation enables automatic switching from the failed memory cell to a redundant memory cell.

Figure 2:
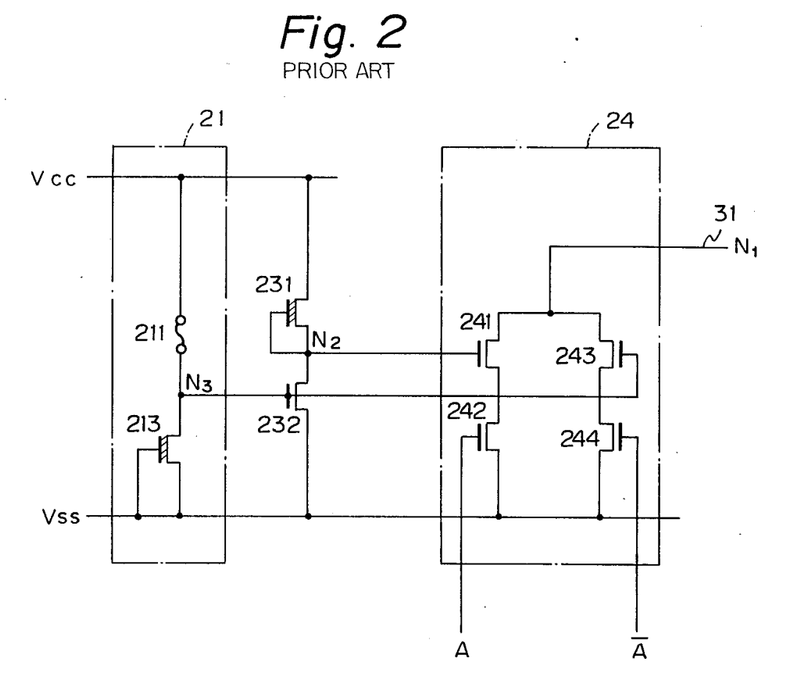
FIGS. 2 and 3 are circuit diagrams of examples of the structure of the coincidence detection circuit used in the circuit of FIG. 1.

An example of the structure of each of the coincidence detection circuits 2, 2, . . . is shown in FIG. 2.

In the circuit of FIG. 2, a fuse 211 and a transistor 213 constitute a fuse blow-out type ROM 21. One bit of the address information of a failed memory cell is stored in this ROM 21. Transistors 231 and 232 constitute an inverter circuit. Transistors 241 to 244 constitute a comparison circuit 24 in the form of an exclusive OR gate circuit. The series-connected transistors 241 and 242 and the series-connected transistors 243 and 244 are connected between the control line 31 ($N_1$) and the voltage source line $V_{ss}$.

The gate of the transistor 241 is connected to the output node $N_2$ of the inverter circuit (231, 232). The gate of the transistor 243 is connected to the output node $N_3$ of the fuse blow-out type ROM (211, 213). The non-inverted address signal A is supplied to the gate of the transistor 242, while the inverted address signal $\overline{A}$ is supplied to the gate of the transistor 244.

In the circuit of FIG. 2, if the fuse 211 is blown, the potential of the output node $N_3$ of the ROM is LOW, and that of the output node $N_2$ of the inverter circuit is HIGH. Hence, the transistor 243 becomes OFF and the transistor 241 becomes ON. Under such a state, when the address signal A is LOW ("0"), the transistor 243 is in the OFF state and the transistor 242 becomes OFF. Hence, the potential of the control line 31 ($N_1$) becomes HIGH. When the address signal A is HIGH ("1"), the transistor 242 becomes ON and, hence, the potential of the control line 31 ($N_1$) becomes LOW.

In the circuit of FIG. 2, if the fuse is not blown, the potential of the node $N_3$ is HIGH, and the potential of the node $N_2$ is LOW. Hence, the transistor 243 becomes ON and the transistor 241 becomes OFF. Under such a state, when the address signal A is LOW while the inverted address signal $\overline{A}$ is HIGH, the potential of the control line 31 ($N_1$) becomes LOW by the operation of the transistors 243 and 244. When the address signal A is HIGH while the inverted address signal $\overline{A}$ is LOW, the potential of the control line 31 ($N_1$) becomes HIGH.

Thus, in the circuit of FIG. 2, the fuse blow-out type ROM (211, 212) stores the address data "0" by the blown state of the fuse 211 and stores the address data "1" by the non-blown state of the fuse 211. Using such stored data, when an input address signal A coincides with the stored data, the potential of the control line 31 ($N_1$) becomes HIGH.

Figure 1:
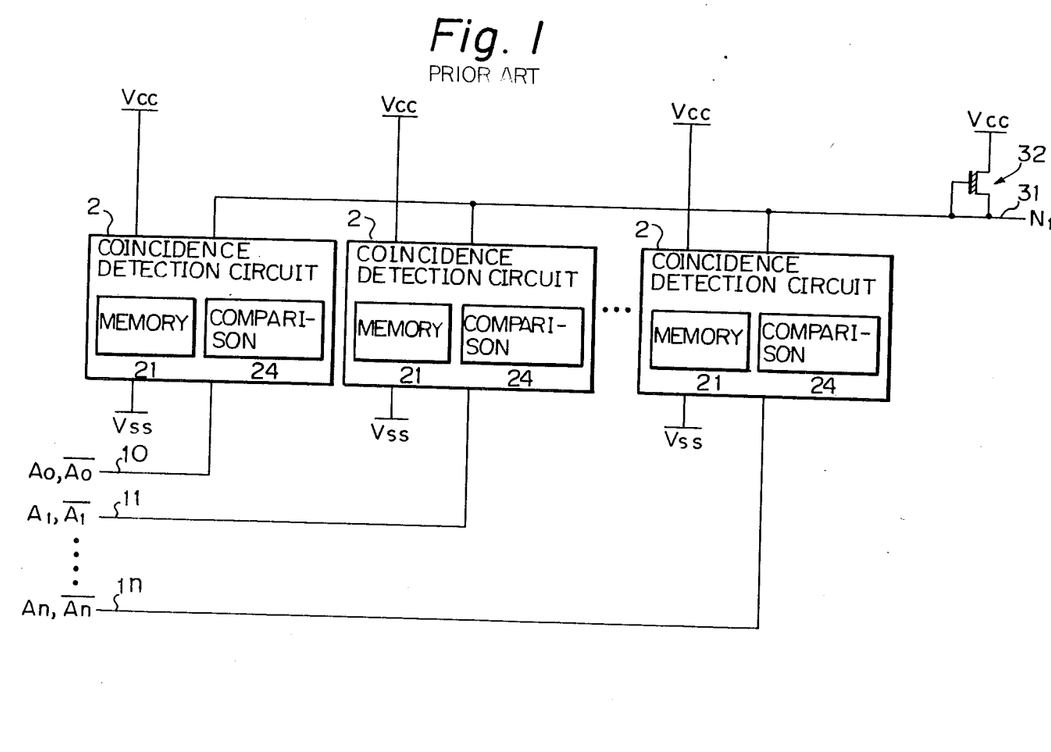
FIG. 1 is block diagram of a prior art integrated circuit.
Figure 3:
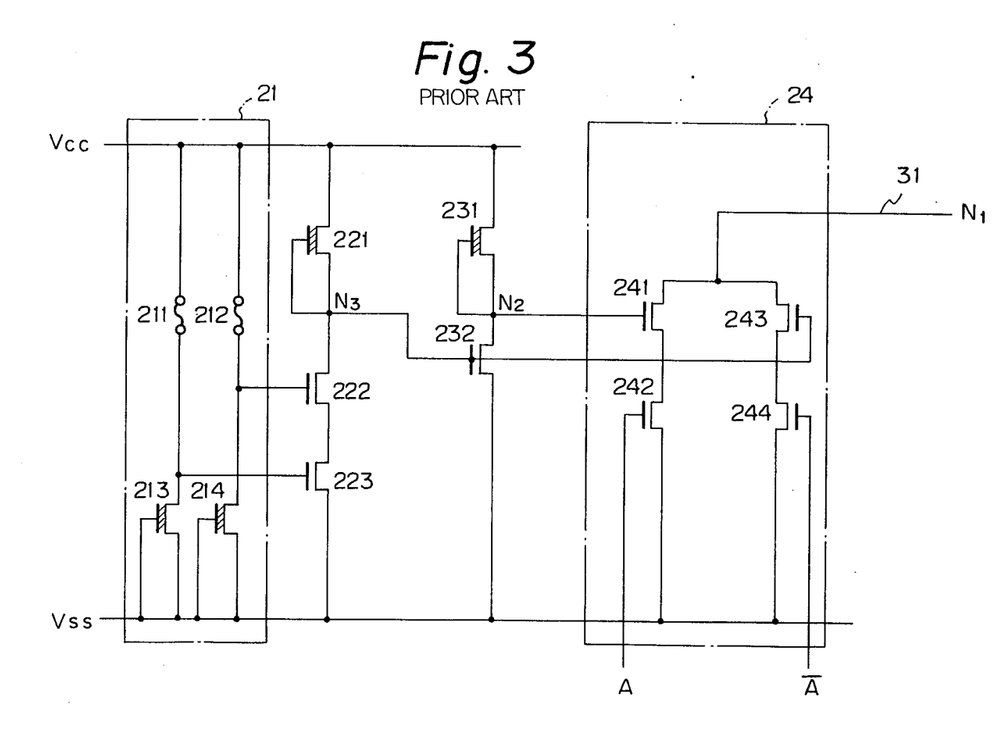

FIG. 3 shows another example of the structure of the coincidence detection circuits 2, 2, ... shown in FIG. 1. The ROM portion 21 of the coincidence detection circuit of FIG. 3 includes a series-connected fuse 211 and a depletion type transistor 213, a series-connected fuse 212 and a depletion type transistor 214. A NAND gate circuit consists of a series-connected depletion type transistor 221, an enhancement type transistor 222, and an enhancement type transistor 223.

When one or more of the fuses 211 and 212 is blown, one of the transistors 222 and 223 is in the OFF state. Hence, the potential of the node $N_3$ is HIGH. When neither the fuse 211 nor the fuse 212 is blown, both the transistors 222 and 223 are ON and, hence, the potential of the node $N_3$ is LOW. Thus, the reliability of the stored data in the ROM portion of the circuit of FIG. 3 is higher than that of the circuit of FIG. 2.

In order to test the data written-in state of the ROM portions of the coincidence detection circuits shown in FIG. 2 and FIG. 3 corresponding to the bits of the address signal, the input address signals $A_0, A_1, \ldots A_n$ are changed successively from "0, 0, ... 0" to "1, 1, ... 1", and the values of the address signals which make the potential of the control line 31 ($N_1$) HIGH are inspected. The values of the address signals $A_0, A_1 \ldots A_n$ which make the potential of the control line 31 ($N_1$) HIGH indicate the address of the failed portion.

Figure 4:
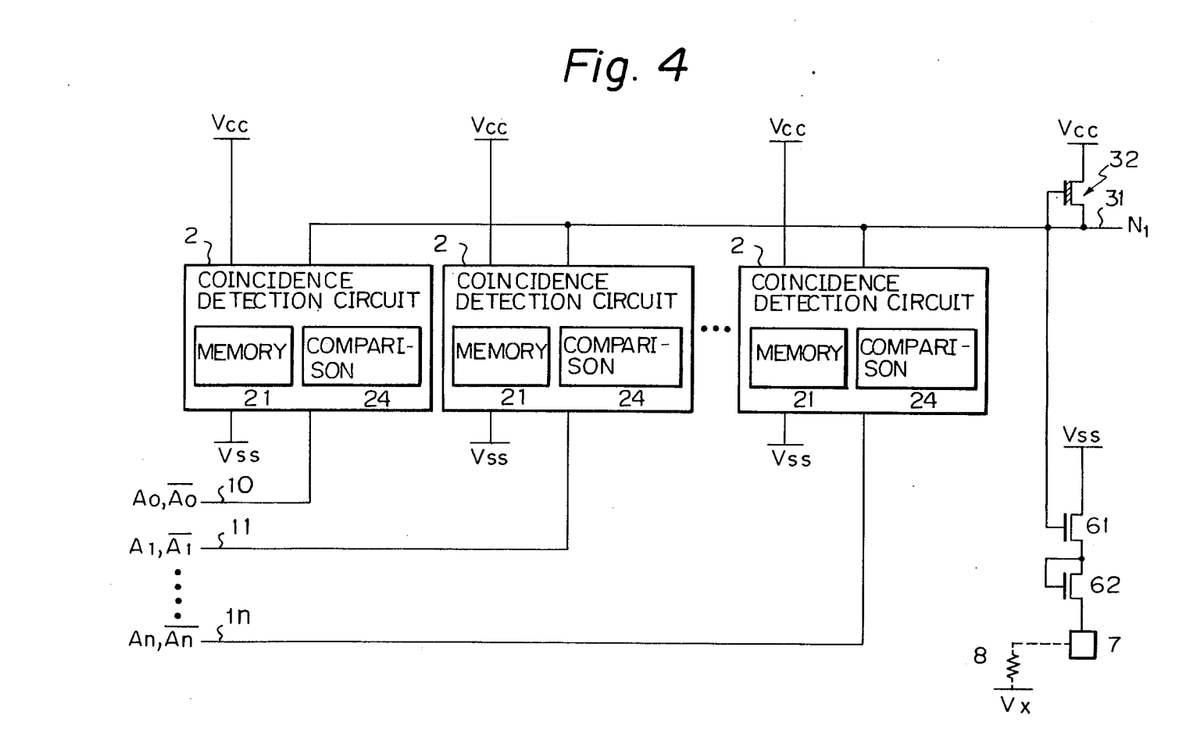
FIG. 4 is a block diagram of an integrated circuit according to an embodiment of the present invention.

A semiconductor integrated circuit according to an embodiment of the present invention is illustrated in FIG. 4. The circuit of FIG. 4 includes coincidence detection circuits 2, 2, ... , a load transistor 32, an output circuit comprising transistors 61 and 62, and an external connection terminal 7. The transistor 32 is connected between a voltage source $V_{cc}$ and the control line 31 ($N_1$) and is operated as a pull-up circuit or a load circuit.

The transistors 61 and 62 are connected in series between the voltage source $V_{ss}$ and an external connection terminal 7. The gate of the transistor 61 is connected to the control line 31 ($N_1$), while the gate of the transistor 62 is connected with the junction of the transistors 61 and 62. The external connection terminal 7 may also be used as a terminal for another signal.

Non-inverted and inverted signals $A_0, \overline{A_0}, A_1, \overline{A_1}, \ldots A_n, \overline{A_n}$ are supplied to the coincidence detection circuits 2, 2, ... in the circuit of FIG. 4. The input address signals are compared with the address signals stored in the ROM's in the coincidence detection circuits. When the compared signals coincide, the impedance between the output terminal of the coincidence detection circuit connected to the control line 31 ($N_1$) and the voltage source $V_{ss}$ becomes HIGH. When the compared signals do not coincide, the above-mentioned impedance becomes LOW.

Thus, when all of the outputs of the coincidence detection circuits 2, 2, ... indicate coincidence, the potential of the control line 31 ($N_1$) becomes HIGH. When one or more of the outputs of the coincidence detection circuits 2, 2, ... indicates non-coincidence, the potential of the control line 31 ($N_1$) becomes LOW. That is, when the address of the failed memory cell stored in the ROM's in the coincidence detection circuits 2 coincide with the input signal address, the potential of the control line 31 becomes HIGH.

Based on this operation, a redundant memory cell is accessed instead of a failed memory cell only when the potential of the control line 31 ($N_1$) is HIGH. Such an arrangement enables automatic switching from the failed memory cell to the redundant memory cell.

Various tests of the integrated circuit can be carried out conveniently by using the information concerning failed bits stored in the ROM's in the coincidence detection circuits 2. The detection of the information stored in the ROM's is carried out by inputting a sequence of varying addresses $A_0, A_1 \ldots A_n$ and detecting sequentially the potentials of the external connection terminal 7 accordingly.

When the input signal address coincides with the address stored in the ROM's, the potential of the control line 31 ($N_1$) becomes approximately $V_{cc}$, as described above. Under this condition, the potential of the external connection terminal 7 is reduced gradually from $V_{ss}$. When the potential reaches the value "$V_{ss}-V_{th}$", where $V_{th}$ is the threshold voltage of each of the transistors 61 and 62, the current starts to flow through the voltage source $V_{ss}$, the transistor 61, the transistor 62, and the external connection terminal 7.

When the input signal address does not coincide with the address stored in the ROM's, the potential of the control line 31 ($N_1$) becomes LOW, that is, approximately $V_{ss}$. Under this condition, the potential of the external connection terminal 7 is reduced gradually from $V_{ss}$. When the potential reaches the value "$V_{ss}-2V_{th}$", the current starts to flow.

Thus, from the potential of the external connection terminal 7, and based on when the current starts to flow through the external connection terminal, it is possible to detect the coincidence between the input signal address and the address stored in the ROM's and to confirm the address of the failed portion of the circuit.

The indication of a resistor 8 and a voltage source $V_x$, for example −3 V, in broken lines is for explaining how current flows through the external connection terminal 7 after application of a voltage $V_x$ through the resistor 8 to the external connection terminal 7.

The coincidence detection circuit shown in FIG. 2 is used for each of the coincidence detection circuits 2, 2, ... in the circuit shown in FIG. 4.

The above description assumed storage of only a single failure address. When plural failure addresses exist, a plurality of the circuits shown in FIG. 4 are used.

Figure 5:
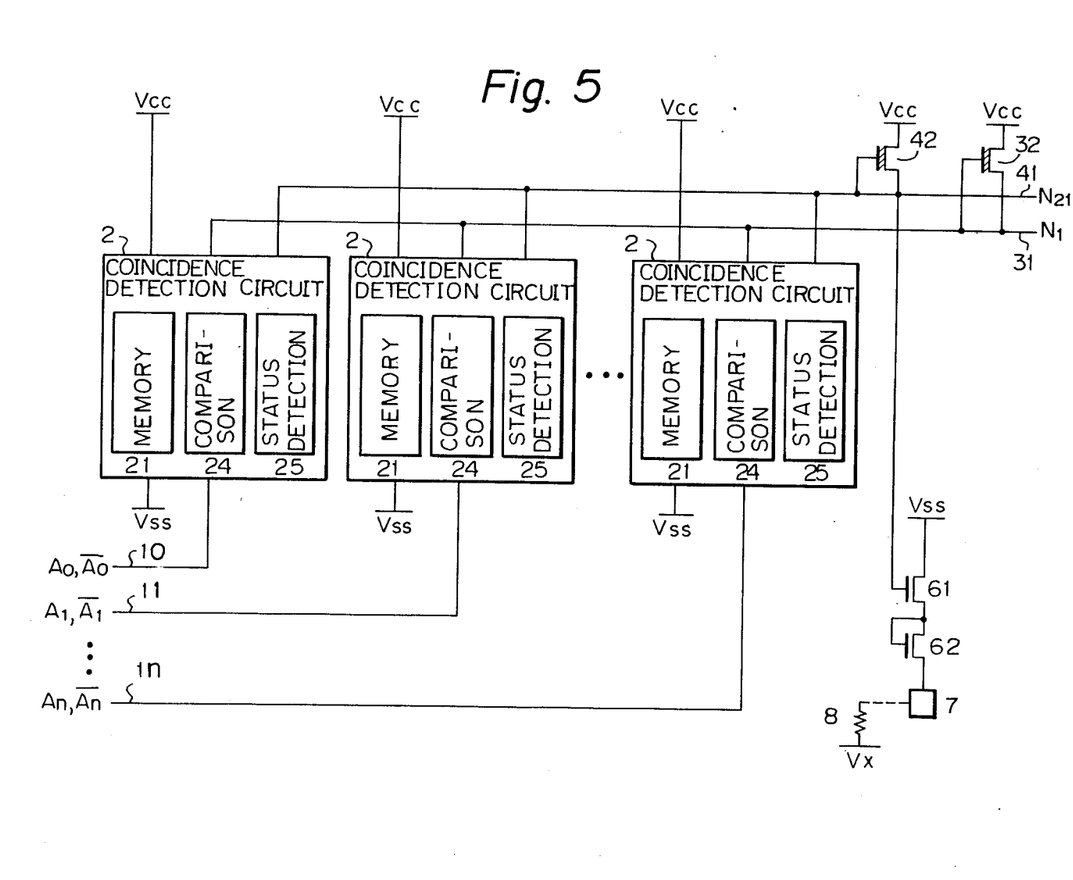
FIG. 5 is a block diagram of an integrated circuit according to another embodiment of the present invention.

A semiconductor integrated circuit according to another embodiment of the present invention is illustrated in FIG. 5. Each of the coincidence detection circuits 2, 2, ... in the circuit shown in FIG. 5 has two output terminals, one connected to a control line 31 ($N_1$), the other connected to a detection line 41 ($N_{21}$). Each of the coincidence detection circuits 2, 2, ... includes a memory portion 21, a comparison portion 24, and a status detection portion 25.

Figure 6:
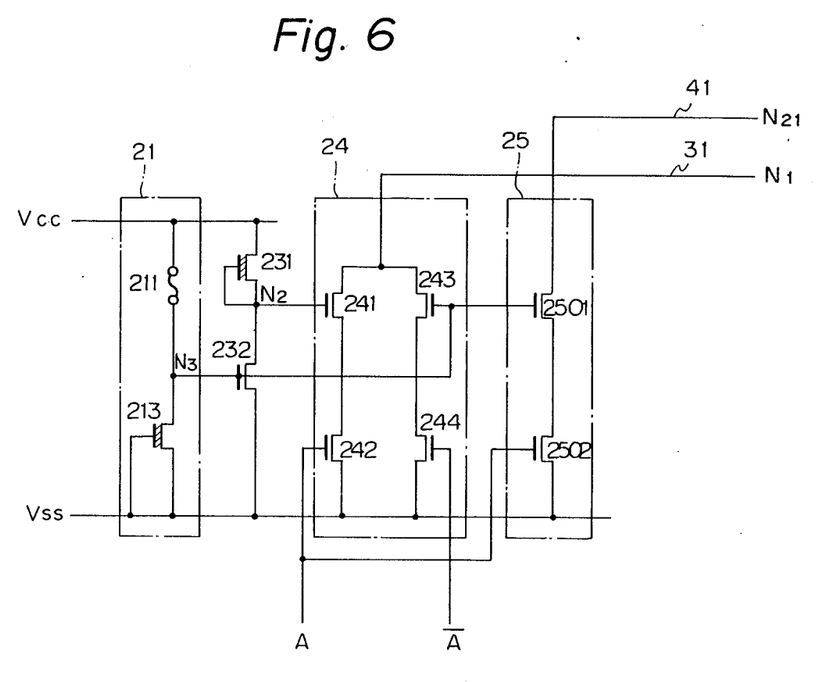
FIGS. 6 to 10 are circuit diagrams of embodiments of a coincidence detection circuit used in the circuits of FIG. 4 and FIG. 5.

The structure of the coincidence detection circuit 2 is illustrated in FIG. 6. The status detection portion 25 includes transistors 2501 and 2502, which are connected in series between a detection line 41 ($N_{21}$) and a voltage source $V_{ss}$. The gate of the transistor 2501 is connected to a node $N_3$ in the ROM 21. The gate of the transistor 2502 receives the input signal A.

In the circuit of FIG. 6, the impedance between the control line 31 ($N_1$) and the voltage source $V_{ss}$ is HIGH when the potentials of the nodes $N_3$ and $N_2$ conform to the input signals A and $\overline{A}$, while the impedance is LOW when the potentials of the nodes $N_3$ and $N_2$ do not conform to the input signal A and $\overline{A}$.

In the circuit of FIG. 6, the potential of the input signal A is made HIGH in order to detect the storage state of the ROM 21, that is, the state of the fuse 211. When the potential of the input signal A is HIGH, the transistor 2502 becomes ON, and the information of the state of the fuse 211 is output to the detection line 41 ($N_{21}$).

That is, when the fuse 211 is blown, the potential of the node $N_3$ is LOW, and the transistor 2501 becomes OFF. Accordingly, the impedance between the control line 31 ($N_1$) and the voltage source $V_{ss}$ is HIGH. Hence, the potential of the detection line 41 ($N_{21}$) becomes HIGH due to the operation of the depletion type transistor 42 (FIG. 5) connected between the detection line 41 ($N_{21}$) and the voltage source $V_{cc}$, so that the blown state of the fuse 211 is detected. In this case, it should be noted that it is required that the potential of just one bit of the address signal be made HIGH and the potentials of all of the other bits of the address signal be made LOW.

When the fuse 211 is not blown, the potential of the node $N_3$ becomes HIGH, and the transistor 2501 becomes ON. Accordingly, the potential of the detection line 41 ($N_{21}$) becomes LOW.

Figure 7:
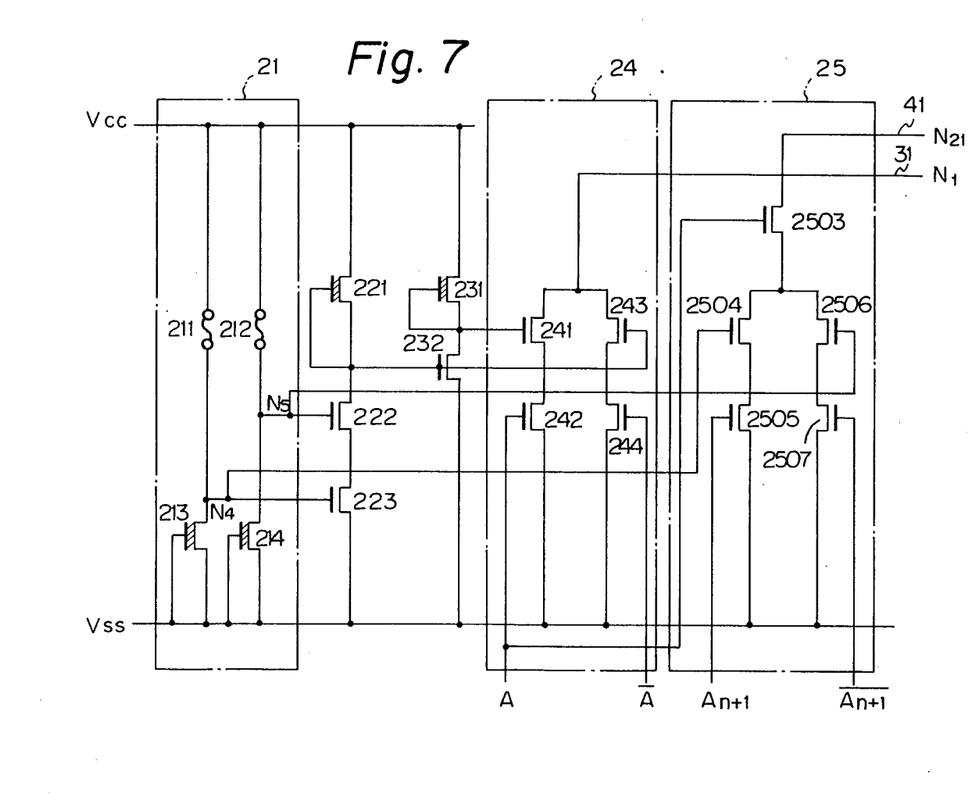

Another example of the structure of the coincidence detection circuit is shown in FIG. 7. The circuit of FIG. 7 is similar to the circuit of FIG. 3, except that the status detection circuit 25 comprising transistors 2503 and 2507 is added. A non-inverted selection signal $A_{n+1}$ and an inverted selection signal $\overline{A_{n+1}}$ are applied to the gates of the transistors 2505 and 2507. A non-inverted address signal A is applied to the gate of the transistor 2503.

In order to detect the state of the fuse 211, the address signal A and the non-inverted selection signal $A_{n+1}$ are made HIGH. Hence, the transistors 2503 and 2505 become ON. Under this condition, when the transistor 2504 is turned on or off corresponding to the potential of the node $N_4$, the potential of the detection line 41 ($N_{21}$) becomes LOW or HIGH accordingly.

Hence, when the fuse 211 is blown, the potential of the node $N_4$ is LOW, the transistor 2504 is OFF, and, accordingly, the potential of the detection line 41 ($N_{21}$) becomes LOW. When the fuse 211 is not blown, the potential of the node $N_4$ is HIGH, the transistor 2504 is ON, and, accordingly, the potential of the detection line 41 ($N_{21}$) becomes HIGH. Thus, by making both the address signal A and the selection signal $A_{n+1}$ HIGH, it is possible to detect the state of the fuse 211.

Similarly, by making the address signal A HIGH and the selection signal $A_{n+1}$ LOW (i.e., the selection signal $\overline{A_{n+1}}$ is HIGH, the information of the state of the fuse 212 is output to the detection line 41 ($N_{21}$).

Thus, in the circuit of FIG. 7, the state of each of the fuses 211 and 212 can be detected separately. The circuit of FIG. 7 is particularly useful for the case where the memory cell matrix is divided by rows or by columns to be divided into a plurality of blocks in which the switching to the redundant circuit is carried out simultaneously in parallel with regard to the plurality of blocks.

Figure 8:
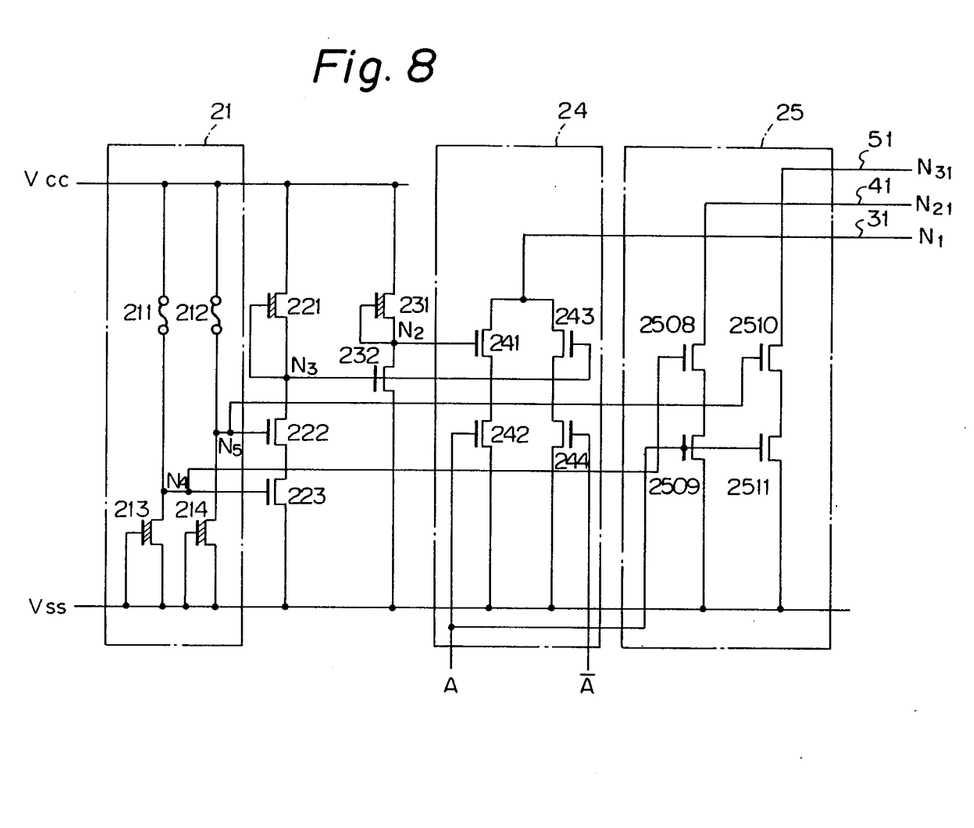

Another example of the structure of the coincidence detection circuit is shown in FIG. 8. The circuit of FIG. 8 includes a status detection circuit 25, comprising transistors 2508 to 2511, and detection lines 41 ($N_{21}$) and 51 ($N_{31}$). Series-connected transistors 2508 and 2509 are connected between the detection line 41 ($N_{21}$) and the voltage source $V_{ss}$, while series-connected transistors 2510 and 2511 are connected between the detection line 51 ($N_{31}$) and the voltage source $V_{ss}$. The gates of the transistors 2508 and 2510 are connected to the nodes $N_4$ and $N_5$, respectively. The gates of the transistors 2509 and 2511 receive the address signal A.

In the circuit of FIG. 8, the transistors 2509 and 2511 are caused to be ON by making the address signal A high. Under this condition, when the fuse 211 is blown, the potential of the node $N_4$ is LOW, the transistor 2508 is OFF, and, accordingly, the potential of the detection line 41 ($N_{21}$) becomes HIGH. When the fuse 211 is not blown, the potential of the node $N_4$ is HIGH, the transistor 2508 is ON, and, accordingly, the potential of the detection line 41 ($N_{21}$) becomes LOW.

Similarly, when the fuse 212 is blown, the transistor 2510 is OFF, and, accordingly, the potential of the detection line 51 ($N_{31}$) becomes HIGH. When the fuse 212 is not blown, the transistor 2510 is ON, and, accordingly, the potential of the detection line 51 ($N_{31}$) becomes LOW.

Thus, in the circuit of FIG. 8, by making the address signal A HIGH, information on the states of the fuses 211 and 212 is output to the detection lines 41 ($N_{21}$) and 51 ($N_{31}$).

In the above described embodiments, the address signal is increased successively by one bit for detecting the state of the ROM corresponding to each of the bits of the address signal. However, in the circuit of FIG. 6, when an inverted address signal $\overline{A}$, instead of a non-inverted address signal A, is supplied to the gate of the transistor 2502, it is possible to detect the state of the fuse 211 by making the address signal A LOW.

By making the address signal applied to the transistor 2502 to be, bit by bit, a non-inverted address signal or an inverted address signal, it is possible to select any pattern of address signals for detecting the written state of the ROM.

An example of the above-described selection of an arbitrary pattern of the address signal is shown in the following tables (A) and (B). Table (A) indicates the address signal supplied to the gate of the transistor 2502. Table (B) indicates the address pattern for detecting the state of the ROM.

TABLE (A)

| Address signal | $A_0$ | $A_1$ | $A_2$ | $A_3$ | $A_4$ | $A_5$ | $A_6$ | $A_7$ |
|---|---|---|---|---|---|---|---|---|
| Address signal supplied to gate of 2502 | $A_0$ | $A_1$ | $\overline{A_2}$ | $\overline{A_3}$ | $\overline{A_4}$ | $A_5$ | $A_6$ | $A_7$ |

TABLE (B)

| Address signal | $A_0$ | $A_1$ | $A_2$ | $A_3$ | $A_4$ | $A_5$ | $A_6$ | $A_7$ |
|---|---|---|---|---|---|---|---|---|
| No bits are selected | 0 | 0 | 1 | 1 | 1 | 0 | 0 | 0 |
| $A_0$ is selected | 1 | 0 | 1 | 1 | 1 | 0 | 0 | 0 |
| $A_1$ is selected | 0 | 1 | 1 | 1 | 1 | 0 | 0 | 0 |
| . | | | | | | | | |
| . | | | | | | | | |
| $A_7$ is selected | 0 | 0 | 1 | 1 | 1 | 0 | 0 | 1 |

Figure 9:
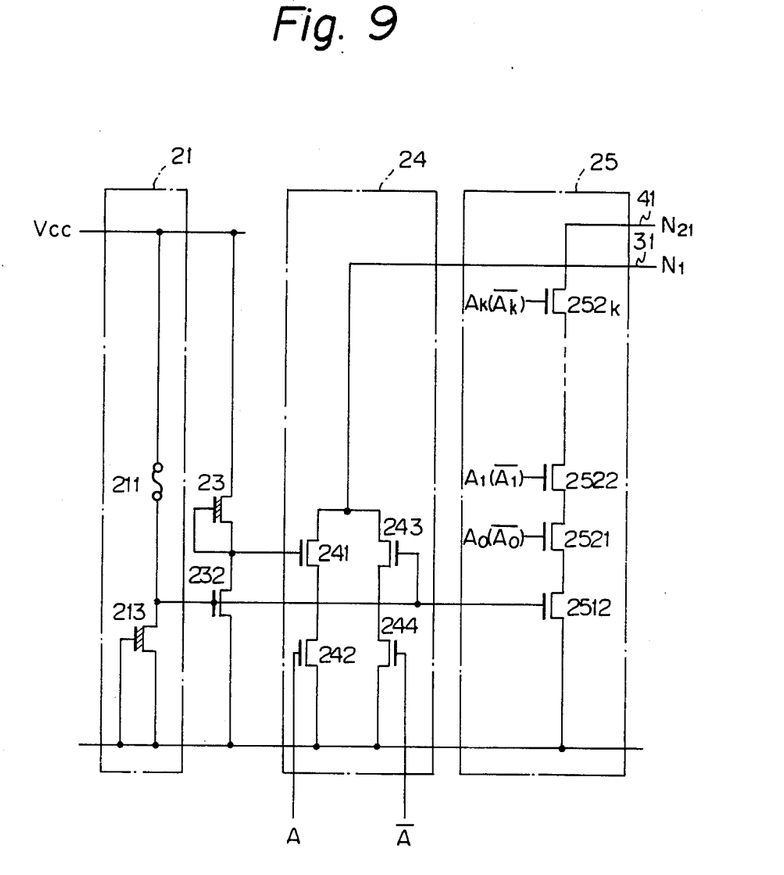

Another example of the structure of the coincidence detection circuit is shown in FIG. 9. The circuit of FIG. 9 includes a status detection circuit 25 comprising transistors 2512, 2521, 2522, . . . 252k. The gate of the transistor 2512 receives the potential of the node $N_3$ which represent the state of the fuse 211. The gates of the transistors 2521, 2522, . . . 252k receive either one of the non-inverted signals A ($A_0$, $A_1$, . . . $A_n$) or one of the inverted signals $\overline{A}$ ($\overline{A_0}$, $\overline{A_1}$, . . . $\overline{A_n}$) of the corresponding bit of the input address. The series-connected transistors 2521, 2522, . . . 252k become ON when the sequence of the signals supplied to the gates of the transistors 2521, 2522, . . . 252k corresponds to a specific address. When the series connected transistors 2521, 2522, . . . 252k are ON, the information of the state of the fuse 211, which is represented by the ON or OFF state of the transistor 2512, is output to the detection line 41 ($N_{21}$).

In the circuit of FIG. 9, $2^{k+1}$ status detection circuits can be realized so that the detection of the states of $2^{k+1}$ fuses can be carried out.

Figure 10:
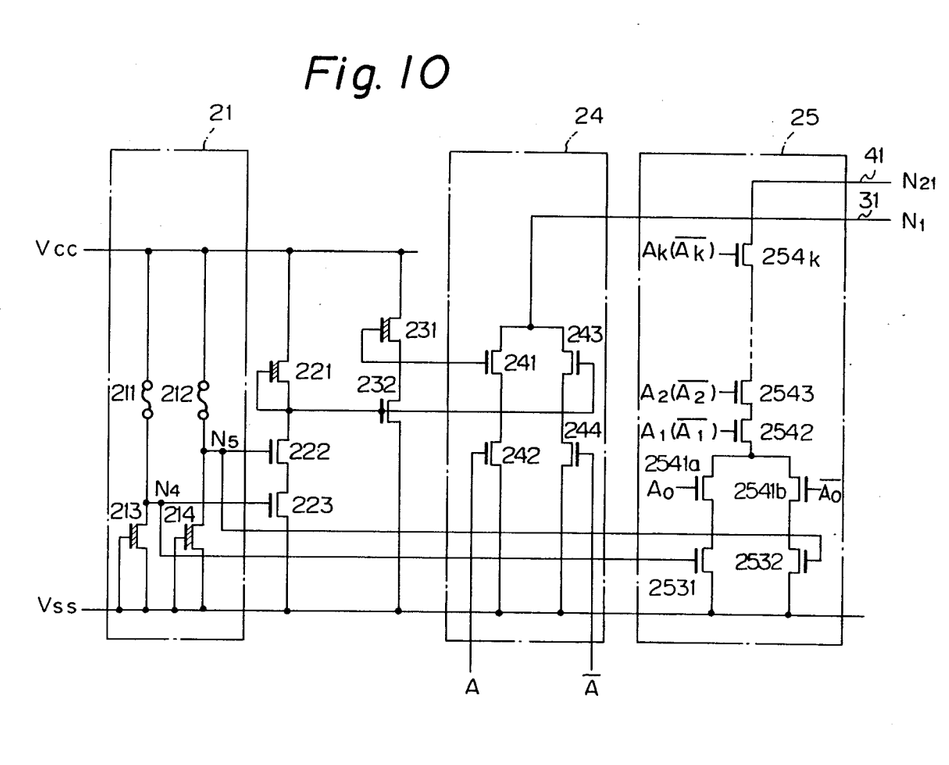

A further example of the structure of the coincidence detection circuit is shown in FIG. 10. The circuit of FIG. 10 includes a status detection circuit 25 comprising transistors 2531, 2532, 2541a, 2541b, 2542, 2543, . . . 254k. The operation of the circuit of FIG. 10 will be apparent from the operations of the circuit of FIG. 7 and the circuit of FIG. 9.

We claim:

1. A semiconductor integrated circuit having a plurality of external connection terminals and operable in response to input address data including a plurality of input address bits applied via at least some of the external connection terminals, said semiconductor integrated circuit comprising:
   memory means for storing address information comprising a plurality of address bits corresponding to a failed circuit portion and for replacing the failed circuit portion by a redundant circuit portion;
   comparison means for detecting coincidence between the plurality of address bits forming the address information and the input address bits forming the input address data, and for generating comparison data at plural output nodes; and
   output circuit means, connected to the output nodes of said comparison means and to one of the external connection terminals, for delivering a coincidence output through said one of the external connection terminals when the comparison data indicates complete coincidence between all the input address bits and all the stored addess bits, respectively, so that the write state of said memory means can be detected based on the received input address data.

2. A circuit according to claim 1, wherein said memory means comprises a fuse and a transistor connected to said fuse.

3. A circuit according to claim 1, wherein said memory means comprises a plurality of memory cells, further comprising:
   a terminal commonly connected to said plural memory cells; and
   status detection means for delivering a status signal indicating the written state of one of said plurality of memory cells in said memory means from said terminal commonly connected to said plural memory cells, by supplying a specific address signal corresponding to said one memory cell.

4. A circuit according to claim 3, wherein each of said memory cells comprises a fuse and a transistor connected to said fuse.

5. A circuit according to claim 3, further comprising a detection line and a voltage source, wherein said status detection means comprises transistors connected in series between said detection line and said voltage source.

6. A circuit according to claim 3, further comprising a detection line and a voltage source, wherein said status detection means comprises a series connection of a transistor and parallel connected sets of series connections of transistors, connected between said detection line and said voltage source.

7. A circuit according to claim 3, further comprising first and second detection lines and a voltage source, wherein said status detection means comprises:
   a first set of transistors connected in series between said first detection line and said voltage source; and
   a second set of transistors connected in series between said second detection line and said voltage source.

8. A circuit according to claim 3, further comprising a detection line and a voltage source, wherein said status detection means comprises a series connection of a set of series connected transistors and parallel connected sets of series connections of transistors, connected between said detection line and said voltage source.

9. A semiconductor integrated circuit operatively connected to receive an input address formed by input address bits and having a redundant circuit portion for replacing a failed circuit portion, comprising:
   a memory for storing address information, formed by stored address bits, corresponding to the failed circuit portion and for providing the address information for accessing the redundant circuit portion in place of the failed circuit portion;
   comparison means, operatively connected to said memory and operatively connected to receive the input address, for detecting coincidence between the stored address bits read from said memory and the input address bits and for generating comparison data; and
   output circuit means, connected to said comparison means, for providing the comparison data from said comparison means, said output circuit means including an external connection terminal through which the comparison data is provided.

10. A circuit according to claim 9, wherein said memory comprises a plurality of memory cells, said circuit further comprising:
- a terminal commonly connected to said plural memory cells; and
- status detection means, operatively connected to said terminal, for providing a status signal, indicating the state of one of said memory cells, from said terminal by supplying a specific address signal corresponding to said one memory cell.

11. A circuit according to claim 10, wherein each of said memory cells comprises a fuse and a transistor connected to said fuse.

* * * * *